United States Patent
Frossard et al.

(10) Patent No.: US 6,637,595 B1
(45) Date of Patent: Oct. 28, 2003

(54) CABLE TIE WRAP HOLDER SYSTEM

(76) Inventors: William D. Frossard, 200 Windward Passage, Clearwater, FL (US) 33767; Suzanne E. Frossard, 200 Windward Passage, Clearwater, FL (US) 33767

( * ) Notice: Subject to any disclaimer, the term of this patent is extended or adjusted under 35 U.S.C. 154(b) by 14 days.

(21) Appl. No.: 10/029,074

(22) Filed: Dec. 21, 2001

(51) Int. Cl.$^7$ ............................................. B65D 85/20
(52) U.S. Cl. ..................... 206/443; 206/388; 211/60.1; 211/128.1; 220/23.2; 220/23.8; 220/476; 220/480
(58) Field of Search ................... 220/23.8, 505, 220/480, 476, 481, 475, 23.83, 513, 506, 507, 23.2, 23.4; 206/379, 388, 443, 526; D19/85; 211/69, 75, 128.1, 69.1, 61, 60.1

(56) References Cited

U.S. PATENT DOCUMENTS

| | | | | |
|---|---|---|---|---|
| 1,563,816 A | * | 12/1925 | Worthington | 206/315.2 |
| 2,881,947 A | * | 4/1959 | Hancock | 221/34 |
| 3,007,618 A | * | 11/1961 | Davis et al. | 224/411 |
| 3,104,778 A | * | 9/1963 | Leonard | 221/34 |
| 4,508,303 A | * | 4/1985 | Beckerer, Jr. | 248/311.2 |
| 4,542,930 A | * | 9/1985 | Adams | 294/160 |
| 5,148,932 A | * | 9/1992 | Orefice | 220/23.2 |
| 5,544,764 A | * | 8/1996 | Cima | 211/60.1 |
| 5,626,240 A | * | 5/1997 | Friedrichs et al. | 209/702 |
| 5,887,774 A | * | 3/1999 | Bethune | 224/414 |

* cited by examiner

Primary Examiner—Lee Young
Assistant Examiner—Joseph C Merek
(74) Attorney, Agent, or Firm—Edward P. Dutkiewicz

(57) ABSTRACT

A cable tie wrap holder system has a plurality of vertically oriented primary tubes in a cylindrical configuration with an open upper end and a closed lower end. A plurality of vertically oriented secondary tubes are in a cylindrical configuration with an open upper end and a closed lower end. The primary tubes are coupled with the secondary tubes to form a tube assembly with the axes of all the tubes parallel with respect to each other.

9 Claims, 4 Drawing Sheets

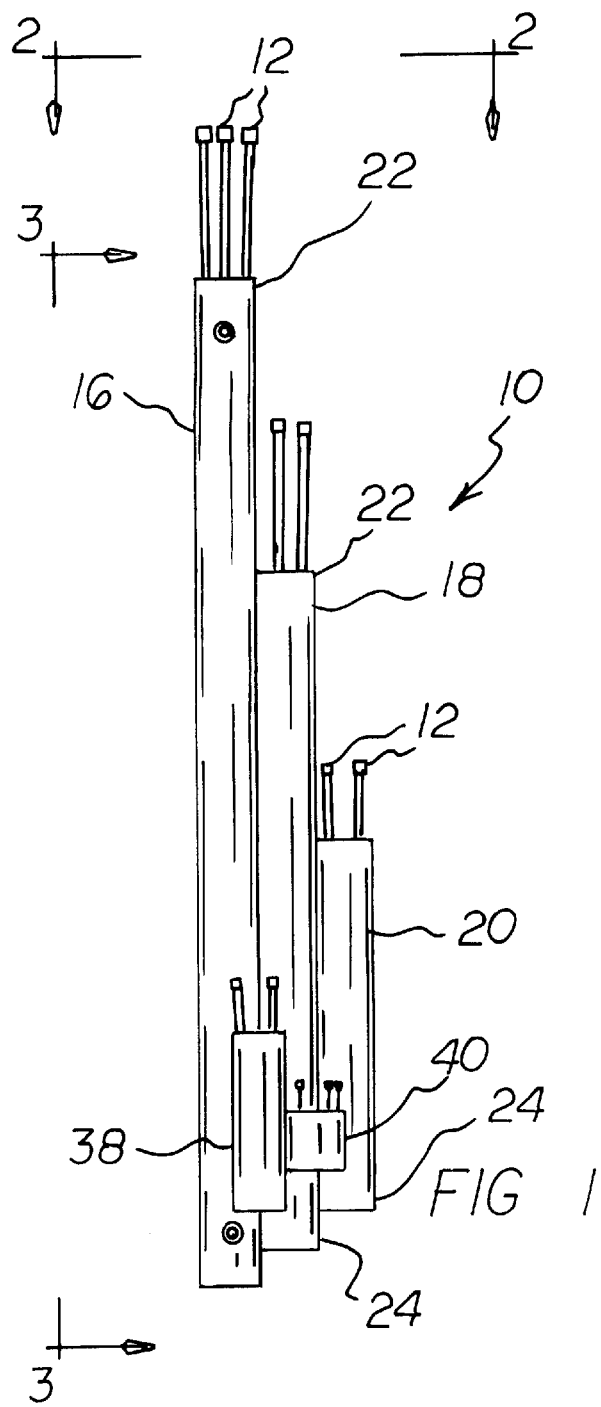
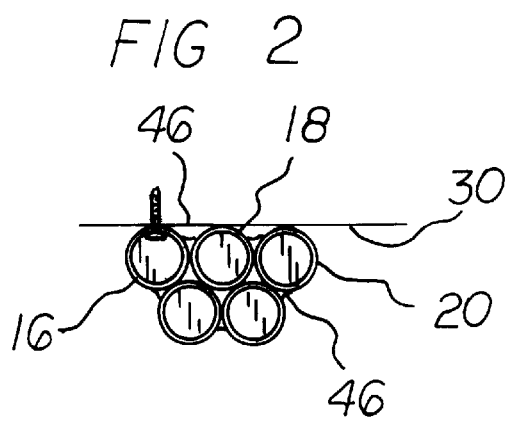

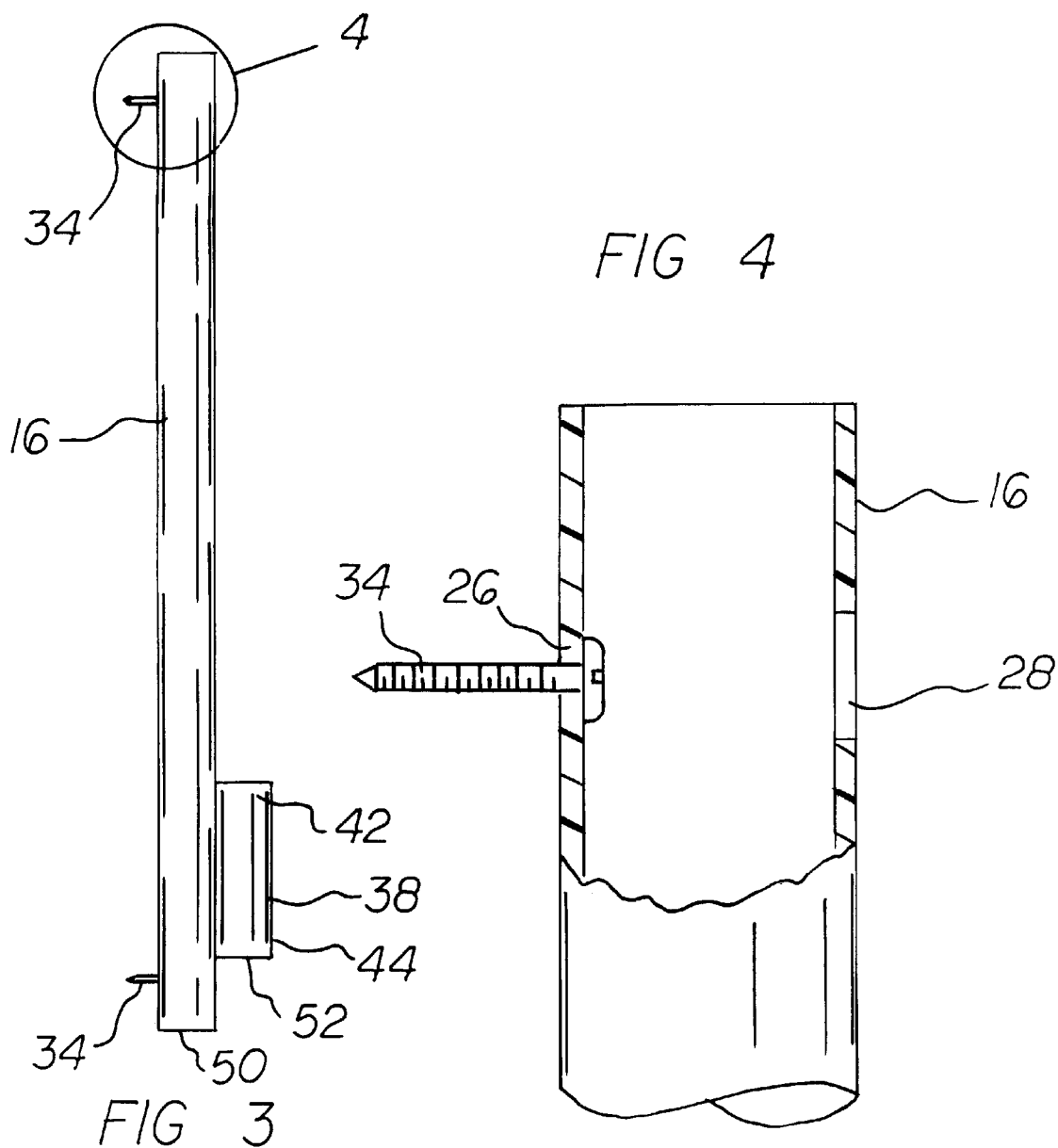

CABLE TIE WRAP HOLDER SYSTEM

BACKGROUND OF THE INVENTION

1. Field of the Invention

The present invention relates to a cable tie wrap holder system and more particularly pertains to maintaining pluralities of tie wraps in predetermined arrays by size for increased convenience and organized space allocation.

2. Description of the Prior Art

The use of holding systems for various objects of known designs and configurations is known in the prior art. More specifically, holding systems for various objects of known designs and configurations previously devised and utilized for the purpose of maintaining objects in an organized manner for increased convenience through known methods and apparatuses are known to consist basically of familiar, expected, and obvious structural configurations, notwithstanding the myriad of designs encompassed by the crowded prior art which has been developed for the fulfillment of countless objectives and requirements.

By way of example, U.S. Pat. No. 5,465,839 to Gretz discloses a golf bag formed from interlocking tubes. U.S. Pat. No. 5,947,306 to Chang discloses a modular rack for flower pot, vase, and the like.

While these devices fulfill their respective, particular objectives and requirements, the aforementioned patents do not describe a cable tie wrap holder system that allows maintaining pluralities of tie wraps in predetermined arrays by size for increased convenience and organized space allocation.

In this respect, the cable tie wrap holder system according to the present invention substantially departs from the conventional concepts and designs of the prior art, and in doing so provides an apparatus primarily developed for the purpose of maintaining pluralities of tie wraps in predetermined arrays by size for increased convenience and organized space allocation.

Therefore, it can be appreciated that there exists a continuing need for a new and improved cable tie wrap holder system which can be used for maintaining pluralities of tie wraps in predetermined arrays by size for increased convenience and organized space allocation. In this regard, the present invention substantially fulfills this need.

SUMMARY OF THE INVENTION

In view of the foregoing disadvantages inherent in the known types of holding systems for various objects of known designs and configurations now present in the prior art, the present invention provides an improved cable tie wrap holder system. As such, the general purpose of the present invention, which will be described subsequently in greater detail, is to provide a new and improved cable tie wrap holder system and method which has all the advantages of the prior art and none of the disadvantages.

To attain this, the present invention essentially comprises a plurality of vertically oriented primary tubes. The tubes are in a cylindrical configuration and are fabricated of polyvinyl chloride. Each primary tube has an open upper end and a closed lower end. The primary tubes have a common diameter. The primary tubes include a long tube. The long tube has a pair of spaced apart smaller apertures and diametrically opposed larger apertures laterally spaced from the smaller apertures. The apertures are axially aligned for positioning of a screwdriver there through to facilitate mounting and unmounting with respect to a vertical planar recipient surface. Next provided is a pair of screws. The screws extend through the smaller apertures for coupling the long tube to the vertical planar recipient surface. The primary tubes also include a pair of additional vertically oriented shorter tubes of decreasing lengths. The shorter tubes are coupled parallel with the long tube. Each primary tube has a surface in a plane common with the recipient surface. A pair of vertically oriented secondary tubes are next provided. The secondary tubes are of different lengths all shorter than the primary tubes. Each secondary tube is in a cylindrical configuration and is fabricated of polyvinyl chloride. Each secondary tube has an open upper end and a closed lower end. The secondary tubes have common diameters common with the primary tubes. The secondary tubes are parallel with each other and parallel with the primary tubes and recipient surface. The axes of the secondary tubes are in a plane parallel with the plane of the recipient surface and the axes of the primary tubes are in a plane there between. An adhesive couples the primary tube with the secondary tubes to form a tube assembly. The axes of all the tubes are parallel with respect to each other and parallel with the recipient surface. Each of the secondary tubes are adjacent to two primary tubes. The upper ends of the secondary tubes are at different elevations and the lower ends are also at different elevations. Each of the tubes has a closed bottom surface whereby sets of tie wraps of different lengths maybe be removably received within the tubes for storage and retrieval purposes.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims attached.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a new and improved cable tie wrap holder system which has all of the advantages of the prior art holding systems for various objects of known designs and configurations and none of the disadvantages.

It is another object of the present invention to provide a new and improved cable tie wrap holder system which may be easily and efficiently manufactured and marketed.

It is further object of the present invention to provide a new and improved cable tie wrap holder system which is of durable and reliable constructions.

An even further object of the present invention is to provide a new and improved cable tie wrap holder system which is susceptible of a low cost of manufacture with regard to both materials and labor, and which accordingly is then susceptible of low prices of sale to the consuming public, thereby making such cable tie wrap holder system economically available to the buying public.

Even still another object of the present invention is to provide a cable tie wrap holder system for maintaining pluralities of tie wraps in predetermined arrays by size for increased convenience and organized space allocation.

Lastly, it is an object of the present invention to provide a new and improved cable tie wrap holder system having a plurality of vertically oriented primary tubes in a cylindrical configuration with an open upper end and a closed lower end, a plurality of vertically oriented secondary tubes in a cylindrical configuration with an open upper end and a closed lower end, the primary tubes coupled with the secondary tubes to form a tube assembly with the axes of all the tubes parallel with respect to each other.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is a front elevational view of the new and improved cable tie wrap holder system constructed in accordance with principals of the present invention.

FIG. 2 is a top elevational view of the system shown in FIG. 1 taken along line 2—2 of FIG. 1.

FIG. 3 is a side elevational view taken along line 3—3 of FIG. 1.

FIG. 4 is an enlarged showing, partially and cross-sectioned, taken at circle 4 of FIG. 3.

The same reference numerals refer to the same parts throughout the various Figures.

DESCRIPTION OF THE PREFERRED EMBODIMENT

Figure 5:
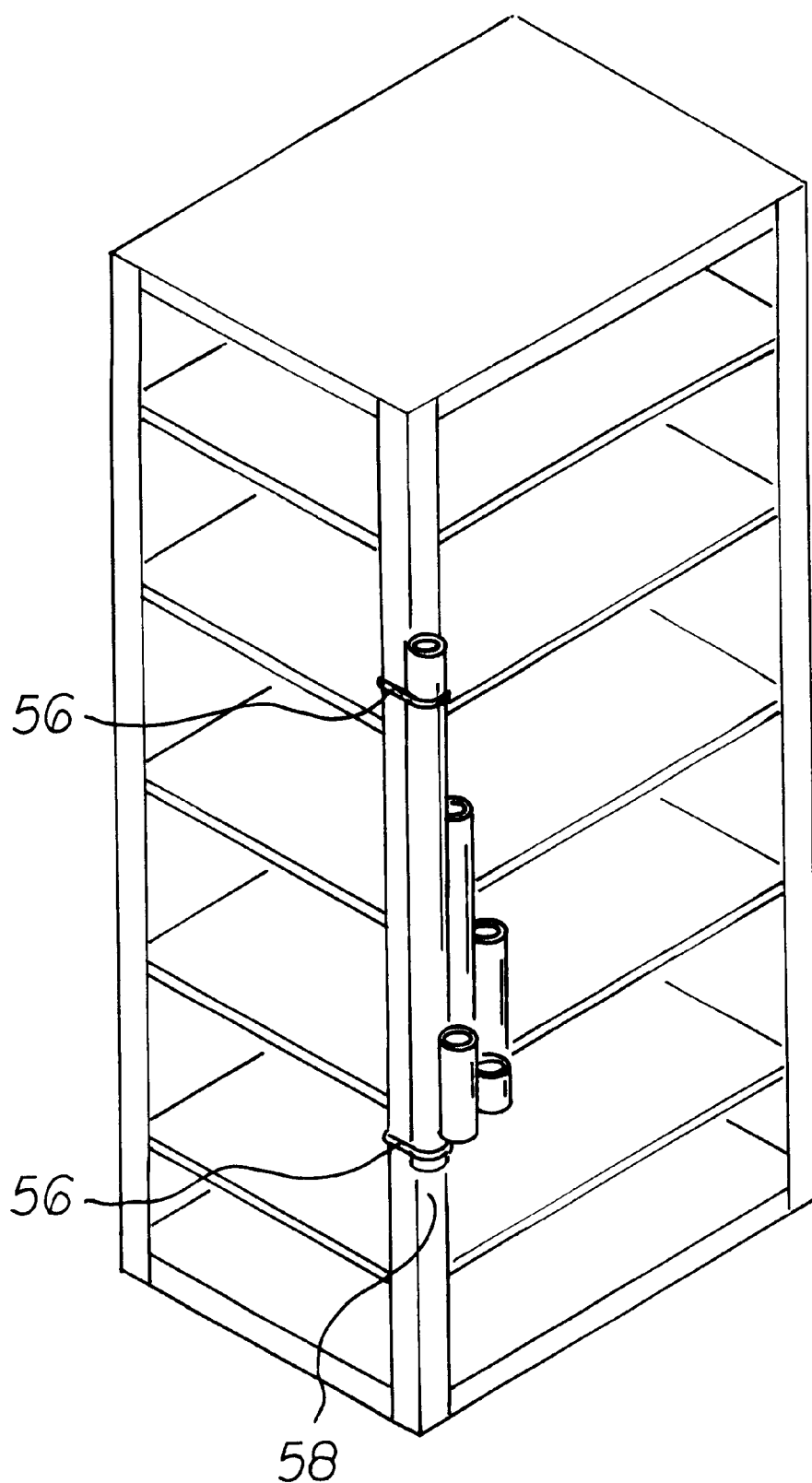
FIG. 5 is a perspective illustration of an alternate embodiment of the invention.

With reference now to the drawings, and in particular to FIG. 1 thereof, the preferred embodiment of the new and improved cable tie wrap holder system embodying the principles and concepts of the present invention and generally designated by the reference numeral 10 will be described.

The present invention, the cable tie wrap holder system 10 is comprised of a plurality of components. Such components in their broadest context include a plurality of vertically oriented primary and secondary tubes. Such components are individually configured and correlated with respect to each other so as to attain the desired objective.

First provided is plurality of vertically oriented primary tubes 16, 18, 20. The tubes are in a cylindrical configuration and are fabricated of polyvinyl chloride. Each primary tube has an open upper end 22 and a closed lower end 24. The primary tubes have a common diameter. The primary tubes include a long tube 16. The long tube has a pair of spaced apart smaller apertures 26 and diametrically opposed larger apertures 28 laterally spaced from the smaller apertures. The apertures are axially aligned for positioning of a screwdriver there through to facilitate mounting and unmounting with respect to a vertical planar recipient surface 30.

Next provided is a pair of screws 34. The screws extend through the smaller apertures for coupling the long tube to the vertical planar recipient surface.

The primary tubes also include a pair of additional vertically oriented shorter tubes 18, 20 of decreasing lengths. The shorter tubes are coupled parallel with the long tube. Each primary tube has a surface in a plane common with the recipient surface.

A pair of vertically oriented secondary tubes 38, 40 are next provided. The secondary tubes are of different lengths all shorter than the primary tubes. Each secondary tube is in a cylindrical configuration and is fabricated of polyvinyl chloride. Each secondary tube has an open upper end 42 and a closed lower end 44. The secondary and primary tubes have common diameters. The secondary tubes are parallel with each other and parallel with the primary tubes and recipient surface. The axes of the secondary tubes are in a plane parallel with the plane of the recipient surface and the axes of the primary tubes are in a plane there between. An adhesive 46 couples the primary tube with the secondary tubes to form a tube assembly. The axes of all the tubes are parallel with respect to each other and parallel with the recipient surface. Each of the secondary tubes are adjacent to two primary tubes. The upper ends of the secondary tubes are at different elevations and the lower ends are also at different elevations. Each of the tubes has a closed bottom surface 52 whereby sets of tie wraps of different lengths maybe be removably received within the tubes for storage and retrieval purposes.

An alternate embodiment of the invention is shown in FIG. 5. In such embodiment, the recipient surface is not a vertical wall, but rather a vertical leg of a storage case. In such embodiment, the apertures through one tube and the associated screws are eliminated in favor of a flexible tie strap or an adhesive tape or the like. More specifically, a flexible strap 56 is positionable around a primary tube for coupling the tubes to a vertically disposed recipient surface 58.

Figure 6:
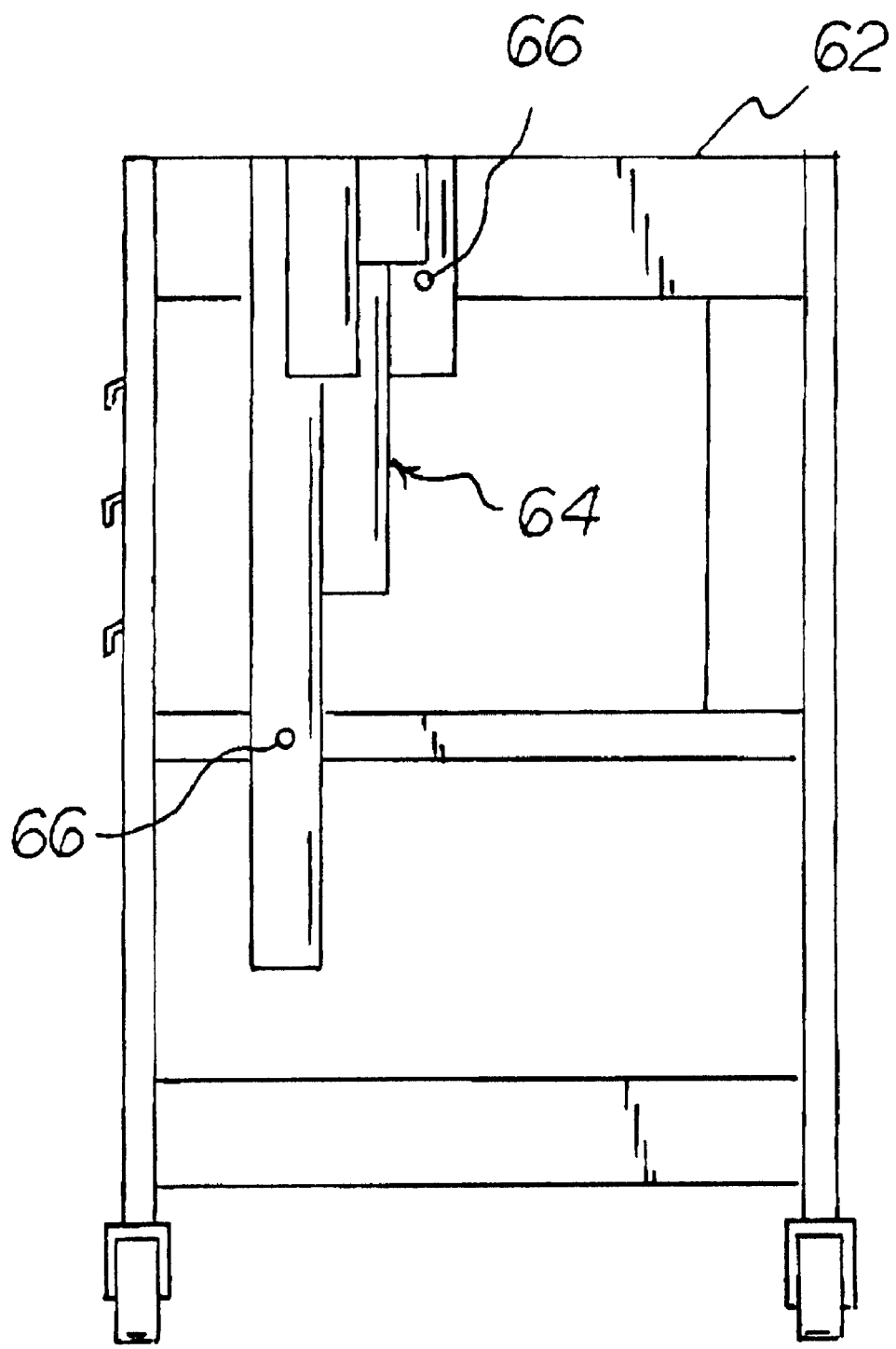
FIG. 6 is a perspective illustration of another alternate embodiment of the invention.

The embodiment of FIG. 6 shows the tubes 64 coupled to a vertical face of a tool cart 62 by sheet metal screws 66. In such embodiment, the tops of all of the tubes are at a common height, co-planar with the top edge of the cart.

It should be understood that the upper ends of the tubes could be at a common height or the lower ends of the tubes could be at a common height or the top ends and the bottom ends could be at different heights. Coupling of the tubes to a recipient surface could be done by any of a variety of couplers including screws, bolts, straps, tape, adhesive, or the like. And although polyvinyl chloride is disclosed as the preferred material for the tubes, they could be fabricated of a wide variety of material including metal, stainless steel, plastic, thermo-plastic, or the like. The tubes could be white or any desired color including a plurality of colors for a color coding correlated to the lengths of the content, tie wraps, cable wraps, cable tie wraps or the like. The preferred tube lengths are from 3 inches to 44 inches to accommodate common tie wrap lengths of 4 inches to 48 inches. The tube diameters are preferably between 1 inch and 3 inches, most preferably 1½ inches, with different or similar diameters in any grouping of tubes.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A cable tie wrap holder system for maintaining pluralities of tie wraps in predetermined arrays by size for increased convenience and organized space allocation comprising, in combination:

a plurality of vertically oriented primary tubes in a cylindrical configuration fabricated of polyvinyl chloride having a common diameter, each primary tube having an open upper end and a closed lower end, the primary tubes including a long tube having a pair of spaced apart smaller apertures and diametrically opposed larger apertures laterally spaced therefrom and axially aligned for positioning of a screwdriver there through to facilitate mounting and unmounting with respect to a vertical planar recipient surface;

a pair of screws extending through the smaller apertures for coupling the long tube to the vertical planar recipient surface;

the primary tubes also including a pair of additional vertically oriented shorter tubes of decreasing lengths coupled parallel with the long tube, each primary tube having a surface in a plane common with the recipient surface;

a pair of vertically oriented secondary tubes of different lengths all shorter than the primary tubes, each secondary tube in a cylindrical configuration fabricated of polyvinyl chloride, each secondary tube having an open upper end and a closed lower end and a common diameter common with the primary tubes, the secondary tubes being parallel with each other and parallel with the primary tubes and recipient surface with the axes of the secondary tubes in a plane parallel with the plane of the recipient surface and the axes of the primary tubes in a plane there between and with an adhesive coupling the primary tube with the secondary tubes to form a tube assembly with the axes of all the tubes parallel with respect to each other and parallel with the recipient surface, each of secondary tubes being adjacent to two primary tubes and the secondary tubes having upper ends at different elevations and lower ends also at different elevations, each of the tubes having a closed bottom surface whereby sets of tie wraps of different lengths maybe removably received within the tubes for storage and retrieval purposes.

2. A cable tie wrap holder system comprising:

a plurality of tie wraps having varying characteristics;

a plurality of vertically oriented primary tubes each in a cylindrical configuration with an open upper end and a closed lower end; and a plurality of vertically oriented secondary tubes in a cylindrical configuration with an open upper end and a closed lower end with the primary tubes coupled with the secondary tubes to form a tube assembly with the axes of all the tubes parallel with respect to each others such that each tube contacts at least two other tubes, the upper ends of the tubes being at varying elevational heights with each tube receiving and supporting tie wraps of one particular characteristic.

3. The system as set forth in claim 2 and further including a pair of spaced apart smaller apertures in one of the primary tubes and diametrically opposed larger apertures laterally spaced thereof and axially aligned for positioning of a screwdriver there through to facilitate mounting and unmounting with respect to a vertical planar recipient surface.

4. The system as set forth in claim 2 and further including a flexible strap positionable around a primary tube for coupling the tubes to a vertically disposed recipient surface.

5. The system as set forth in claim 2 and further including apertures in at least some of the primary tubes with sheet metal screws for attachment to a vertical face of a metal recipient surface and with the lower ends of all of the tubes at a common height.

6. A cable tie wrap holder system comprising:

a plurality of tie wraps having varying characteristics;

a plurality of vertically oriented primary tubes each in a cylindrical configuration with an open upper end and a closed lower end; and a plurality of vertically oriented secondary tubes in a cylindrical configuration with an open upper end and a closed lower end with the primary tubes coupled with the secondary tubes to form a tube assembly with the axes of all the tubes parallel with respect to each other such that each tube contacts at least two other tubes the lower ends of the tubes being at varying elevational heights with each tube receiving and supporting tie wraps of one particular characteristic.

7. The system as set forth in claim 6 and further including a pair of spaced apart smaller apertures in one of the primary tubes and diametrically opposed larger apertures laterally spaced thereof and axially aligned for positioning of a screwdriver there through to facilitate mounting and unmounting with respect to a vertical planar recipient surface.

8. The system as set forth in claim 6 and further including a flexible strap positionable around a primary tube for coupling the tubes to a vertically disposed recipient surface.

9. The system as set forth in claim 6 and further including apertures in at least some of the primary tubes with sheet metal screws for attachment to a vertical face of a metal recipient surface and with the upper ends of all of the tubes at a common height.

* * * * *